United States Patent
Park et al.

(10) Patent No.: US 10,509,077 B2
(45) Date of Patent: Dec. 17, 2019

(54) METHOD AND APPARATUS FOR ESTIMATING STATE OF BATTERY

(71) Applicant: SAMSUNG ELECTRONICS CO., LTD., Suwon-si (KR)

(72) Inventors: SangDo Park, Seoul (KR); Kaeweon You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 15/864,252

(22) Filed: Jan. 8, 2018

(65) Prior Publication Data

US 2018/0203072 A1    Jul. 19, 2018

(30) Foreign Application Priority Data

Jan. 17, 2017 (KR) .................... 10-2017-0007869

(51) Int. Cl.
| | | |
|---|---|---|
| *G01R 31/36* | (2019.01) | |
| *G01R 31/367* | (2019.01) | |
| *G01R 31/387* | (2019.01) | |
| *G01R 31/392* | (2019.01) | |
| *G01R 31/382* | (2019.01) | |
| *G01R 31/3835* | (2019.01) | |

(52) U.S. Cl.
CPC ......... *G01R 31/367* (2019.01); *G01R 31/387* (2019.01); *G01R 31/392* (2019.01); *G01R 31/382* (2019.01); *G01R 31/3835* (2019.01)

(58) Field of Classification Search
CPC .................................................. G01R 31/36
See application file for complete search history.

(56) References Cited

U.S. PATENT DOCUMENTS

| | | | |
|---|---|---|---|
| 6,252,377 B1 * | 6/2001 | Shibutani | G01R 31/3648 320/132 |
| 8,519,674 B2 | 8/2013 | Anderson et al. | |
| 8,525,519 B2 | 9/2013 | Johnson et al. | |
| 8,669,741 B2 | 3/2014 | Seo et al. | |
| 8,903,667 B2 | 12/2014 | Sato et al. | |
| 9,026,347 B2 | 5/2015 | Gadh et al. | |
| 9,063,201 B2 * | 6/2015 | Rhodin | G01R 31/3842 |
| 2009/0248334 A1 | 10/2009 | Sans et al. | |

(Continued)

FOREIGN PATENT DOCUMENTS

| | | |
|---|---|---|
| EP | 2 980 596 A1 | 2/2016 |
| KR | 10-0836391 B1 | 6/2008 |

(Continued)

OTHER PUBLICATIONS

Extended European Search Report dated Jun. 20, 2018 in corresponding European Patent Applcation No. 18150986.0 (10 pages in English).

*Primary Examiner* — Clayton E. LaBalle
*Assistant Examiner* — Jas A Sanghera
(74) *Attorney, Agent, or Firm* — NSIP Law (57) ABSTRACT

A battery state estimation method and apparatus are provided. Sensing data of a battery is received, and feature information is acquired by preprocessing the sensing data. The preprocessed sensing data is selected based on the feature information, and state information of the battery is determined based on at least one of the selected preprocessed sensing data or previous state information of the battery.

21 Claims, 9 Drawing Sheets

(56) References Cited

U.S. PATENT DOCUMENTS

| | | | |
|---|---|---|---|
| 2011/0012604 A1* | 1/2011 | Tsujiko | H01M 10/48 |
| | | | 324/427 |
| 2015/0061687 A1 | 3/2015 | Shim | |
| 2016/0061908 A1 | 3/2016 | Torai et al. | |
| 2016/0149272 A1 | 5/2016 | Imaizumi | |
| 2016/0231388 A1 | 8/2016 | Park | |

FOREIGN PATENT DOCUMENTS

| | | | |
|---|---|---|---|
| KR | 10-1277733 B1 | 6/2013 |
| KR | 10-1352841 B1 | 1/2014 |
| KR | 10-1543263 B1 | 8/2015 |

* cited by examiner

METHOD AND APPARATUS FOR ESTIMATING STATE OF BATTERY

CROSS-REFERENCE TO RELATED APPLICATION(S)

This application claims the benefit under 35 USC § 119(a) of Korean Patent Application No. 10-2017-0007869, filed on Jan. 17, 2017, in the Korean Intellectual Property Office, the entire disclosure of which is incorporated herein by reference for all purposes.

BACKGROUND

1. Field

The following description relates to a method and apparatus for estimating a state of a battery.

2. Description of Related Art

Many electronic devices include a rechargeable battery. To manage the rechargeable battery, the electronic device may include a battery management system (BMS). The BMS estimates a battery state, for example, a state of charge (SOC) or a state of health (SOH), to optimize the operation of the electronic device or the battery. The availability of the battery is extended based on an accuracy of estimation of the SOC and SOH, and thus, it is important that the BMS accurately estimates the battery state.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect there is provided, a battery state estimation method including receiving sensing data of a battery, acquiring feature information by preprocessing the sensing data, selecting the preprocessed sensing data based on the feature information, and determining state information of the battery based on either one or both of the selected preprocessed sensing data and previous state information of the battery.

The feature information may include any one or any combination of a data size of the preprocessed sensing data and a variance value of the preprocessed sensing data.

The selecting of the preprocessed sensing data may include calculating a reliability of the preprocessed sensing data based on the feature information, and selecting the preprocessed sensing data by comparing the reliability to a threshold.

The selection of the preprocessed sensing data may include selecting the preprocessed sensing data in response to a length of the preprocessed sensing data being greater than or equal to a threshold.

The selection of the preprocessed sensing data may include calculating a deviation between each of sample values of the preprocessed sensing data and a previous sample value of the each of the sample values, and selecting the preprocessed sensing data based on a variance of the calculated deviation.

The determining of the state information may include determining the state information based on a previous state information in response to the preprocessed sensing data not being selected.

The determining of the state information may include determining the previous state information as the state information in response to the preprocessed sensing data not being selected.

The determining of the state information may include determining the state information based on the preprocessed sensing data in response to the preprocessed sensing data being selected.

The acquiring of the feature information may include filtering the sensing data, and downsampling the filtered sensing data.

The preprocessed sensing data may correspond to data suitable for estimation of a state of the battery, in response to the preprocessed sensing data being selected, and the preprocessed sensing data may correspond to data unsuitable for the estimation of the state of the battery, in response to the preprocessed sensing data not being selected.

In another general aspect there is provided, a battery state estimation apparatus including a controller configured to receive sensing data of a battery, to acquire feature information by preprocessing the sensing data, select the preprocessed sensing based on the feature information, and to determine state information of the battery based on either one or both of the selected preprocessed sensing data and previous state information of the battery.

The feature information may include any one or any combination of a data size of the preprocessed sensing data and a variance value of the preprocessed sensing data.

The controller may be configured to calculate a reliability of the preprocessed sensing data based on the feature information and to select the preprocessed sensing data by comparing the reliability to a threshold.

The controller may be configured to select the preprocessed sensing data in response to a length of the preprocessed sensing data being greater than or equal to a threshold.

The controller may be configured to calculate a deviation between each of sample values of the preprocessed sensing data and a previous sample value of the each of the sample values, and to select the preprocessed sensing data based on a variance of the calculated deviation.

The controller may be configured to determine the state information based on a previous state information in response to the preprocessed sensing data not being selected.

The controller may be configured to determine the previous state information as the state information in response to the preprocessed sensing data not being selected.

The controller may be configured to determine the state information based on the preprocessed sensing data in response to the preprocessed sensing data being selected.

The controller may be configured to filter the sensing data and to downsample the filtered sensing data.

The preprocessed sensing data may correspond to data suitable for estimation of a state of the battery, in response to the preprocessed sensing data being selected, and the preprocessed sensing data may correspond to data unsuitable for the estimation of the state of the battery, in response to the preprocessed sensing data not being selected.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various modifications may be made to examples. However, it should be understood that these examples are not construed as limited to the illustrated forms and include all changes, equivalents or alternatives within the idea and the technical scope of this disclosure.

The terminology used herein is for the purpose of describing particular examples only and is not intended to be limiting of examples. As used herein, the singular forms are intended to include the plural forms as well, unless the context clearly indicates otherwise.

Regarding the reference numerals assigned to the elements in the drawings, it should be noted that the same elements will be designated by the same reference numerals, wherever possible, even though they are shown in different drawings. Also, in describing of examples, detailed description of well-known related structures or functions will be omitted when it is deemed that such description will cause ambiguous interpretation of the present disclosure.

Figure 1:
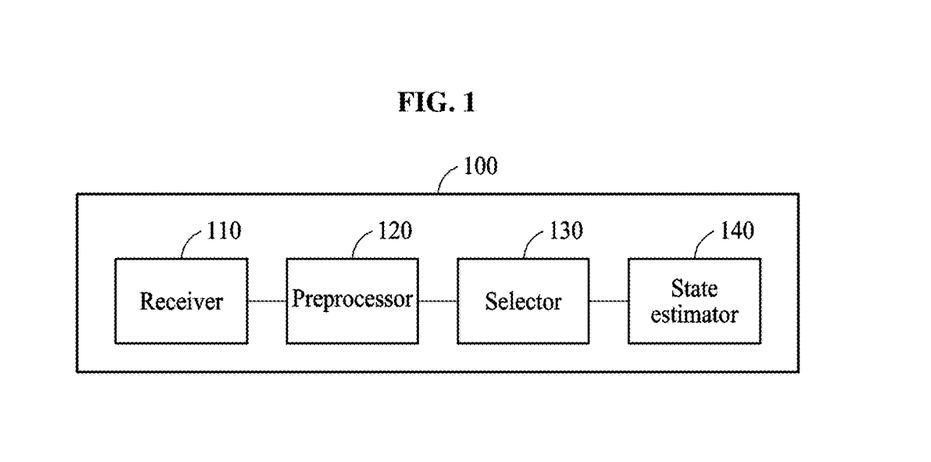
FIG. 1 is a diagram illustrating an example of a battery state estimation apparatus.

FIG. 1 illustrates an example of a battery state estimation apparatus 100.

Referring to FIG. 1, the battery state estimation apparatus 100 includes a receiver 110, a preprocessor 120, a selector 130, and a state estimator 140.

The receiver 110, the preprocessor 120, the selector 130, and the state estimator 140 are implemented by, for example, at least one processing device (for example, a processor or a controller).

The receiver 110 receives sensing data from a battery, such as, for example, a battery cell, a battery module, or a battery pack.

The receiver 110 receives sensing data of a battery from at least one sensor. In an example, a voltage sensor generates voltage data of a battery by sensing a voltage of the battery at preset intervals (for example, at each time interval of 1 second) and transmits the generated voltage data to the battery state estimation apparatus 100. The receiver 110 receives the voltage data from the voltage sensor. In another example, a current sensor generates current data of a battery by sensing a current of the battery at preset intervals (for example, at each time interval of 1 second) and transmits the generated current data to the battery state estimation apparatus 100. The receiver 110 receives the current data from the current sensor. The voltage sensor and the current sensor are merely examples of the sensor, and other sensors may be used without departing from the spirit and scope of the illustrative examples described.

The preprocessor 120 preprocesses the sensing data. For example, the preprocessor 120 removes noise from the sensing data. In an example, the preprocessor 120 downsamples the sensing data. For example, when a voltage of the battery is sensed at each time interval of 1 second for 150 minutes, the receiver 110 sequentially receives 9,000 pieces of voltage data. The preprocessor 120 downsamples the 9,000 pieces of voltage data at a preset downsampling rate (for example, per minute). In this example, 150 pieces of voltage data remain after the downsampling. The removing and the downsampling described above are merely examples of the preprocessing, and the preprocessing performed by the preprocessor 120 is not limited to those described above.

The selector 130 acquires feature information of the preprocessed sensing data, and determines, based on the feature information, whether the preprocessed sensing data is to be selected. For example, the selector 130 determines, based on the feature information, whether the preprocessed sensing data is suitable for estimation a state of the battery or whether the preprocessed sensing data reliable.

In an example, the selector 130 verifies a data length of the preprocessed sensing data, and determines, based on the data length, whether the preprocessed sensing data is to be selected. When the data length is greater than or equal to a threshold length, the selector 130 selects the preprocessed sensing data. When the data length is less than the threshold length, the selector 130 does not select the preprocessed sensing data. For example, when a number of pieces of sensing data remaining after the sensing data is downsampled is greater than or equal to a number of pieces of sensing data (for example, 130 pieces of sensing data), the selector 130 selects the preprocessed sensing data. In an example, when the number of pieces of sensing data remaining after the sensing data is downsampled is less than the predetermined number of pieces of sensing data, the selector 130 does not select the preprocessed sensing data. The data length will be further described with reference to FIG. 2 below.

In another example, the selector 130 determines statistical information of the preprocessed sensing data. The selector 130 determines whether the preprocessed sensing data is to be selected based on the statistical information. The statistical information includes, for example, a variance, and other statistical information sensors may be used without departing from the spirit and scope of the illustrative examples described. The statistical information will be further described with reference to FIGS. 3 and 4 below.

The state estimator 140 determines state information of the battery, based on at least one of the preprocessed sensing data or previous state information of the battery, according to a determination result of the selector 130. The state information includes, for example, a capacity or life information (for example, a state of health (SOH)) of a battery. The state information is not limited to those described above, and other state information, such as, state of charge (SOC) may be used without departing from the spirit and scope of the illustrative examples described.

When the selector 130 selects the preprocessed sensing data, the state estimator 140 determines the state information based on the preprocessed sensing data. For example, the state estimator 140 determines, using a battery model, determines the state information based on the preprocessed sensing data. The battery model is a model configured to output state information in response to an input of the sensing data. For example, the battery model is configured to output an SOH of a battery in response to an input of sensing data (or preprocessed sensing data) of the battery. The battery model includes, for example, an electrochemical model, or a model that is based on a neural network (for example, a recurrent neural network (RNN)). The battery model is not limited to those described above, and other battery models may be used without departing from the spirit and scope of the illustrative examples described.

The battery model is stored in a memory (not shown) in the battery state estimation apparatus 100. At least one parameter applied to the battery model is also stored in the memory.

When the selector 130 does not select the preprocessed sensing data, the state estimator 140 determines the state information based on the previous state information. An example of an operation of the state estimator 140 when the selector 130 does not select the preprocessed sensing data will be described with reference to FIGS. 5 and 6 below.

The battery state estimation apparatus 100 does not perform an operation based on sensing data that is unsuitable for state estimation, and thus it is possible to save computing resources. Also, the battery state estimation apparatus 100 performs an operation based on sensing data suitable for the state estimation, to estimate the state of the battery, and thus it is possible to increase an accuracy of estimation of a current state of the battery.

Figure 2:
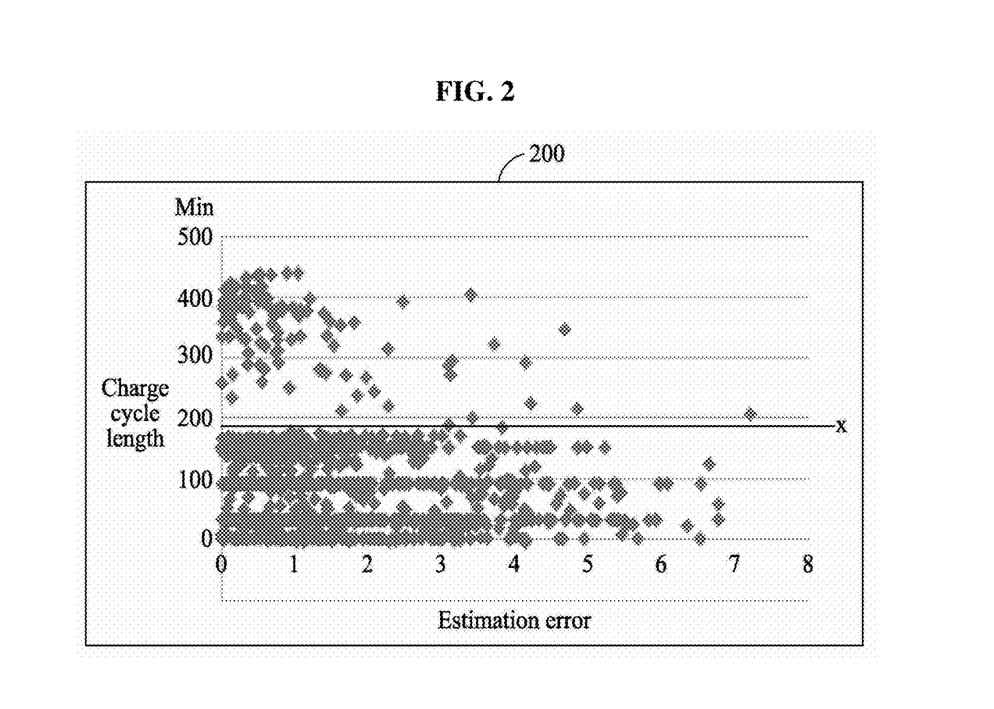
FIG. 2 is a diagram illustrating an example of a distribution of estimation errors for each data length.

FIG. 2 illustrates an example of a distribution of estimation errors for each data length.

FIG. 2 is a diagram 200 illustrating the distribution of the estimation errors.

In the graph 200, an x-axis represents an estimation error. The estimation error is a difference between a real capacity of a battery and an estimated capacity of the battery.

An increase in the estimation error indicates a low accuracy for estimating the capacity of the battery. In FIG. 2, a value of "3" indicates an estimation error of about 5%.

In FIG. 2, a y-axis represents a charge cycle length. The charge cycle length is a charge duration. A quantity of sensing data to be generated increases as the length of the charge cycle increases, and accordingly the charge cycle length is a data length of the sensing data.

In an example, when the charge cycle length is less than a length x, estimation errors are distributed in a region with values that are greater than "0" and less than or equal to "6." As the data length decreases, there is an increase in a range in which the estimation errors are distributed. Thus, when a current state of the battery is estimated based on sensing data corresponding to a short charge cycle length (that is, a short data length), it is difficult to guarantee that an estimation error of the estimated current state is low. For example, when a current capacity of a battery is estimated based on sensing data corresponding to a charge cycle length of 100 minutes (min), an estimation error of the estimated current capacity corresponds to a value less than "1" or a value greater than "3" in the graph 200. It is difficult to guarantee that the estimation error of the estimated current state corresponds to the value less than "1." Thus, sensing data with a short data length has a low reliability for state estimation and is unsuitable for the state estimation.

In another example, when the charge cycle length is greater than or equal to the length x, estimation errors are mainly distributed in a region with values less than "1." In other words, as the data length increases, a range in which estimation errors are distributed decreases and an estimation accuracy increases. Thus, when a current state of the battery is estimated based on sensing data corresponding to a long charge cycle length (that is, a long data length), an estimation error of the estimated current state is low. For example, when a current capacity of a battery is estimated based on sensing data corresponding to a charge cycle length of 400 min, a probability that an estimation error of the estimated current capacity has a value less than "1" in the graph 200 is high. Thus, sensing data with a long data length has a high reliability for state estimation and is suitable for the state estimation.

A data length of sensing data (or preprocessed sensing data) is associated with a reliability and estimation accuracy of the sensing data (or the preprocessed sensing data). Thus, the selector 130 selects the sensing data (or the preprocessed sensing data) based on the data length.

Figure 3:
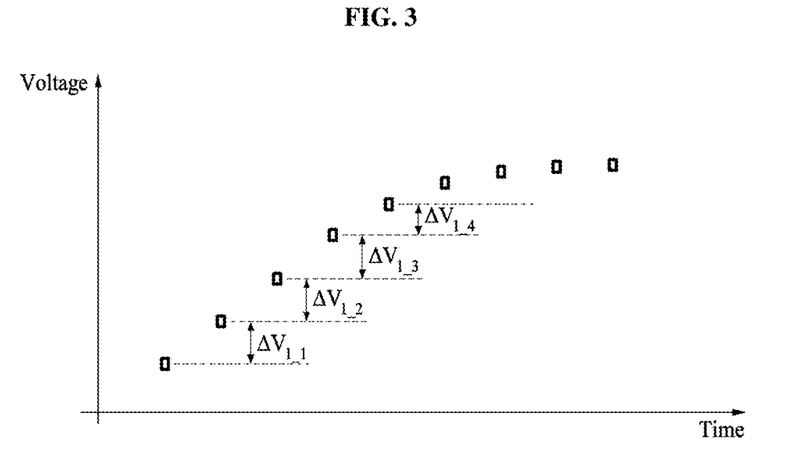
FIGS. 3 and 4 are diagrams illustrating examples of statistical information of sensing data.
Figure 4:
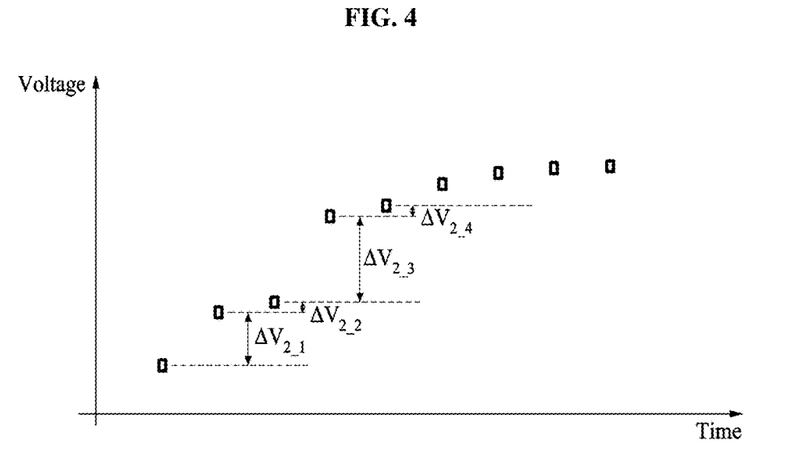

FIGS. 3 and 4 illustrate examples of statistical information of sensing data.

FIG. 3 illustrates voltage data of battery 1. The selector 130 determines statistical information (for example, a variance of a deviation) of the voltage data of the battery 1. For example, the selector 130 calculates a deviation between sample values of the voltage data of the battery 1, and determines the statistical information based on the deviation. In FIG. 3, the selector 130 calculates a difference $\Delta V_{1\_1}$ between a first sample value and a second sample value, and a difference $\Delta V_{1\_2}$ between the second sample value and a third sample value. Similarly, the selector 130 calculates differences $\Delta V_{1\_3}$ and $\Delta V_{1\_4}$. The selector 130 determines a variance of the differences $\Delta V_{1\_1}$ through $\Delta V_{1\_4}$ as the statistical information. The statistical information of the voltage data of the battery 1 is denoted by var1.

In FIG. 3, the difference $\Delta V_{1\_1}$ corresponds to a largest deviation in the voltage data of the battery 1. The difference $\Delta V_{1\_2}$ is less than the difference $\Delta V_{1\_1}$, and the difference $\Delta V_{1\_3}$ is less than the difference $\Delta V_{1\_2}$. When the deviation between the sample values of the voltage data of the battery 1 gradually decreases, a relatively small amount of the statistical information var1 is obtained, and the selector 130 selects the voltage data of the battery 1. In other words, the selector 130 determines the voltage data of the battery 1 to have a high reliability or to be suitable for estimation of a state of the battery 1.

FIG. 4 illustrates voltage data of a battery 2. The voltage data of the battery 2 includes noise (not shown). In FIG. 4, the selector 130 calculates differences $\Delta V_{2\_1}$, $\Delta V_{2\_2}$, $\Delta V_{2\_3}$, and $\Delta V_{2\_4}$, and determines a variance of the differences $\Delta V_{2\_1}$ through $\Delta V_{2\_4}$ as statistical information of the voltage data of the battery 2. The state information of the voltage data of the battery 2 is denoted by var2.

In FIG. 4, a deviation between sample values of the voltage data of the battery 2 does not gradually decrease due to the noise. The deviation between the sample values irregularly changes, for example, decreases and then increases, instead of gradually decreasing. For example, the difference $\Delta V_{2\_2}$ is less than the difference $\Delta V_{2\_1}$ and the difference $\Delta V_{2\_3}$ is greater than the difference $\Delta V_{2\_2}$ due to the noise. When the deviation between the sample values of the voltage data of the battery 2 does not gradually decrease, a relatively large amount of the statistical information var2 is obtained, and the selector 130 does not select the voltage data of the battery 2. In other words, the selector 130 determines the voltage data of the battery 2 to have a low reliability or to be unsuitable for estimation of a state of the battery 2.

Noise has an influence on an accuracy of estimation of a state of a battery. Due to the noise, estimation error occurs. Accordingly, the selector 130 does not select sensing data that is expected to create estimation error in estimating the state of the battery.

The voltage data of FIG. 3 and the voltage data of FIG. 4 are merely examples of sensing data, and the sensing data is not limited to the voltage data of FIG. 3 or 4. The above description of FIGS. 3 and 4 are also applicable to data (for example, current data or temperature data) associated with the other physical quantities of a battery.

Figure 5:
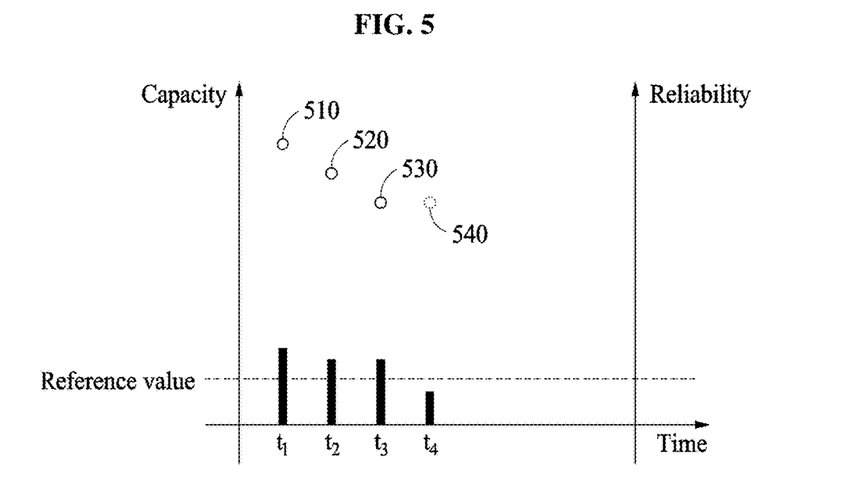
FIGS. 5 and 6 are diagrams illustrating examples of estimation of a state of a battery when sensing data is unsuitable for the estimation of the state.
Figure 6:
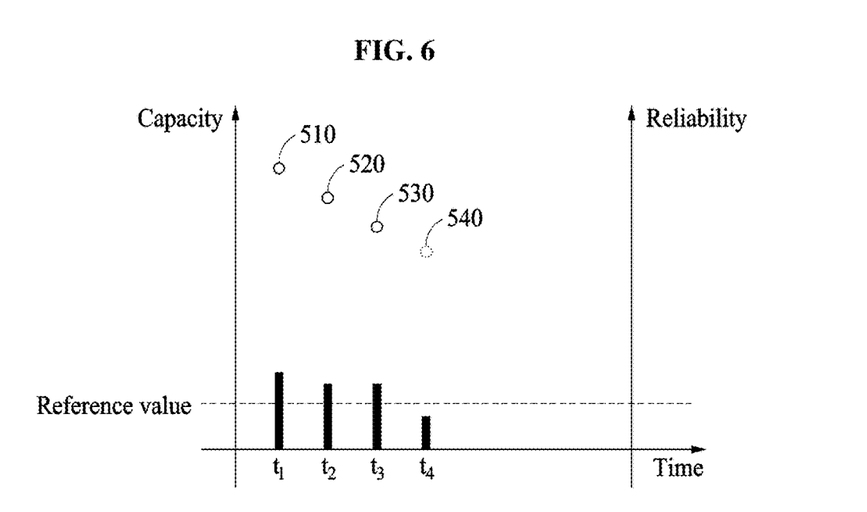

FIGS. 5 and 6 illustrate examples of estimation of a state of a battery when sensing data is unsuitable for the estimation of the state.

FIG. 5 illustrates a capacity of a battery over time and a reliability of sensing data.

The reliability of the sensing data is digitized. For example, the selector 130 calculates or determines the reliability based on feature information of the sensing data. In an example, the selector 130 determines the reliability based on a data length or statistical information.

The selector 130 calculates the reliability based on both the data length and the statistical information. For example, the selector 130 determines, based on a lookup table, a first score corresponding to the data length and a second score corresponding to the statistical information, and determines a sum of the first score and the second score as the reliability. In an example, a weight is applied to the first score and/or the second score. The reliability is also referred to as a suitability.

A reliability of sensing data at a time $t_1$ is greater than a reference value. Accordingly, the selector 130 determines that the sensing data at the time $t_1$ is suitable for state estimation, and the state estimator 140 estimates a capacity 510 based on the sensing data at the time $t_1$.

A reliability of sensing data at a time $t_2$ is greater than the reference value, and accordingly the selector 130 selects the sensing data at the time $t_2$. The state estimator 140 estimates a capacity 520 based on the sensing data at the time $t_2$. Similarly, the state estimator 140 estimates a capacity 530 based on sensing data at a time $t_3$.

A reliability of sensing data at a time $t_4$ is less than the reference value. For example, when sensing data includes noise, for example, a sensor error, or when a data length is not long enough because a battery is charged for a relatively short period of time, a reliability of the sensing data is less than the reference value. The selector 130 determines that the sensing data at the time $t_4$ is unsuitable for state estimation. The state estimator 140 estimates a capacity 540 based on the capacities 510, 520 and/or 530 that are already estimated, instead of using the sensing data at the time $t_4$. Thus, the state estimator 140 does not need to perform an operation based on the sensing data at the time $t_4$, to prevent unnecessary use of resources.

In an example, referring to FIG. 5, the state estimator 140 determines the capacity 540 to be equal to the capacity 530. In other words, the state estimator 140 determines the capacity 540 as the capacity 530. In an example, the state estimator 140 applies an extrapolation to the capacities 510, 520 and/or 530, to estimate the capacity 540. The state estimator 140 determines an average value of the capacities 510 through 530 as the capacity 540. Various extrapolation schemes are applicable to estimation of the capacity 540.

In another example, referring to FIG. 6, the state estimator 140 estimates the capacity 540 based on a reduction in an efficiency due to an increase in a number of cycles. In an example, a cumulative number of charge and discharge cycles at a time $t_3$ is assumed as $n_1$, and a cumulative number of charge and discharge cycles at a time $t_4$ is assumed as $n_2$. In this example, the state estimator 140 determines that the efficiency is reduced by a value obtained by subtracting $n_1$ from $n_2$ and applies the reduced efficiency to the capacity 530, to estimate the capacity 540. When the reduced efficiency is denoted by $cap_1$, the capacity 540 is determined as a value obtained by subtracting $cap_1$ from the capacity 530.

When a reliability of sensing data at the time $t_4$ is less than the reference value, the state estimator 140 skips estimation of a state of a battery at the time $t_4$. In other words, when the reliability of the sensing data at the time $t_4$ is less than the reference value, the capacity 540 at the time $t_4$ is not estimated.

Figure 7:
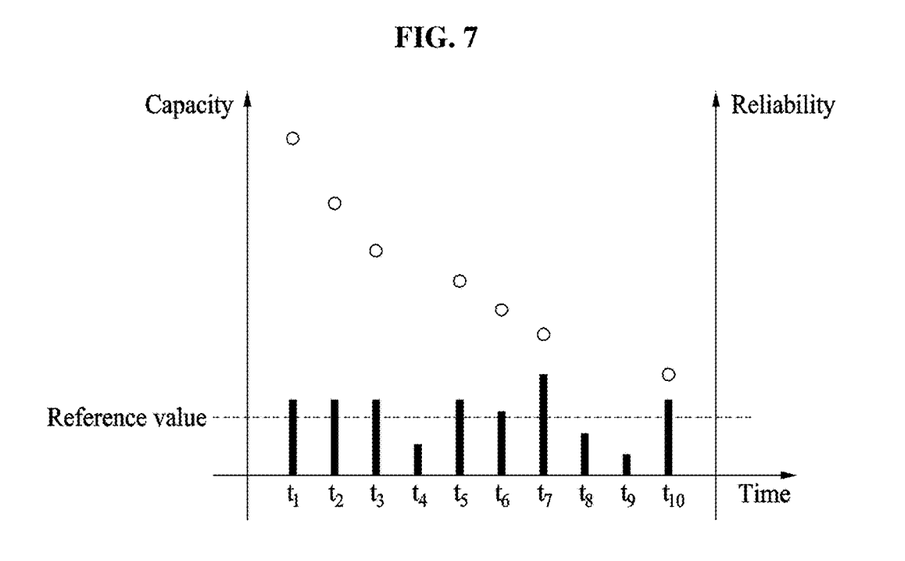
FIG. 7 is a diagram illustrating an example of a battery state estimation result.

FIG. 7 illustrates an example of a battery state estimation result.

FIG. 7 illustrates a capacity of a battery over time.

At times $t_4$, $t_8$ and $t_9$ in which reliabilities are less than a reference value, the capacity of the battery is not estimated.

For example, when a request for estimated capacities of the battery is received from a server, estimated capacities of the battery at the times $t_4$, $t_8$ and $t_9$ are required. In an example, the state estimator 140 applies an interpolation to the estimated capacities, to estimate the capacities at the times $t_4$, $t_8$ and $t_9$.

Figure 8:
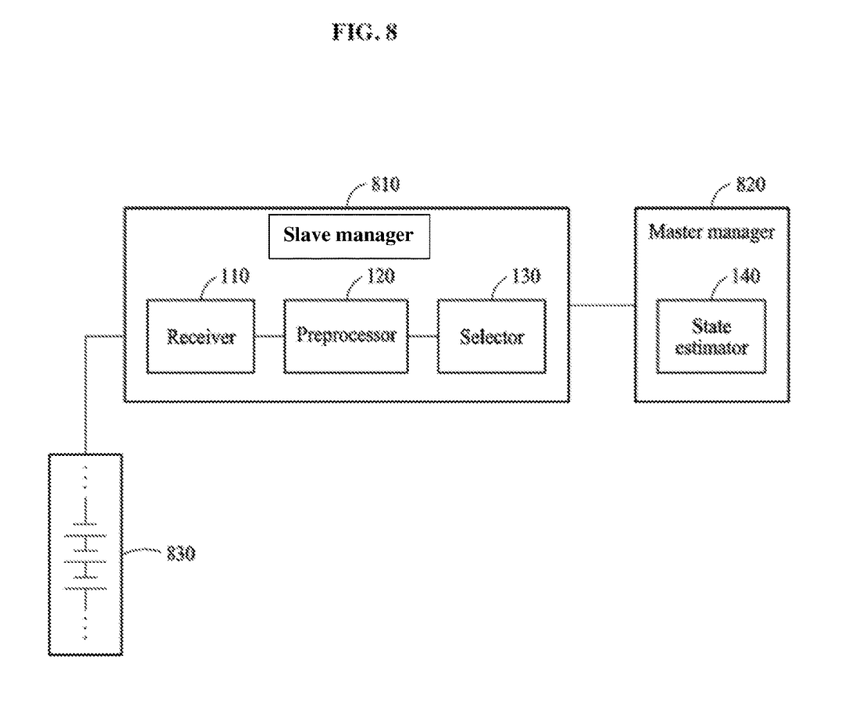
FIGS. 8 and 9 are diagrams illustrating examples of a battery management system (BMS) with a master-slave structure.
Figure 9:
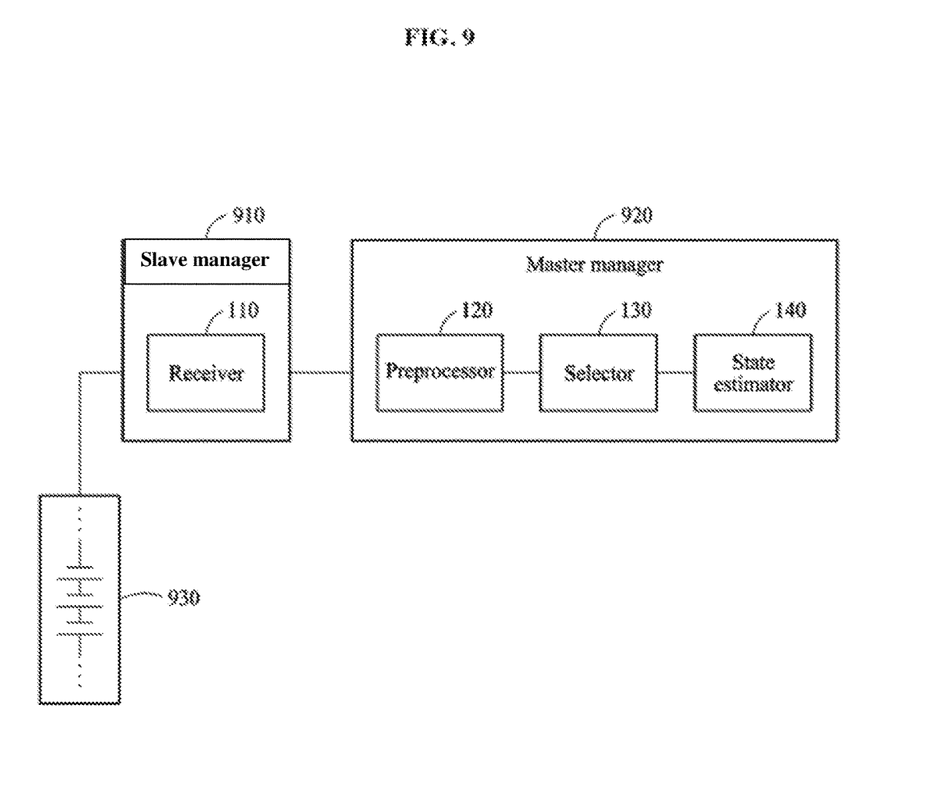

FIGS. 8 and 9 illustrate examples of a battery management system (BMS) with a master-slave structure.

Referring to FIGS. 8 and 9, a BMS includes a slave manager 810 or 910, and a master manager 820 or 920. In another example, the BMS includes a plurality of slave managers 810 or 910.

The slave manager 810 or 910 manages and/or controls each of battery cells included in a battery pack 830 or 930. The master manager 820 or 920 controls the slave manager 810 or 910.

The slave manager 810 or 910 and the master manager 820 or 920 perform functions or operations of the above-described battery state estimation apparatus 100 of FIG. 1. The examples of FIGS. 8 and 9 are described below.

In the example of FIG. 8, the slave manager 810 includes a receiver 110, a preprocessor 120 and a selector 130, and the master manager 820 includes a state estimator 140.

In FIG. 8, the slave manager 810 receives sensing data of each of the battery cells from a sensor, preprocesses the sensing data, and determines whether the preprocessed sensing data is to be selected. When the preprocessed sensing data is selected, the slave manager 810 transmits the preprocessed sensing data to the master manager 820.

When the preprocessed sensing data is received from the slave manager 810, the master manager 820 determines state information of each of the battery cells based on the preprocessed sensing data. When the preprocessed sensing data is not received from the slave manager 810, the master manager 820 determines state information of each of the battery cells based on previous state information. The master manager 820 determines state information of the battery pack 830 based on the state information of each of the battery cells.

Depending on examples, when the preprocessed sensing data is selected, the slave manager 810 determines state information of each of the battery cells based on the preprocessed sensing data, instead of transmitting the preprocessed sensing data to the master manager 820. The master manager 820 receives the state information of each of the battery cells from the slave manager 810 and determines state information of the battery pack 830 based on the received state information.

In the example of FIG. 9, the slave manager 910 includes a receiver 110, and the master manager 920 includes a preprocessor 120, a selector 130 and a state estimator 140.

The slave manager 910 receives sensing data of each of battery cells from a sensor, and transmits the sensing data to the master manager 920. The master manager 920 preprocesses the sensing data, and determines whether the preprocessed sensing data is to be selected. When the preprocessed sensing data is selected, the master manager 920 determines state information of each of the battery cells based on the preprocessed sensing data. The master manager 920 determines state information of the battery pack 930 based on the state information of each of the battery cells.

Depending on examples, the slave manager 910 preprocesses sensing data of each of the battery cells and transmits the preprocessed sensing data to the master manager 920. The master manager 920 determines whether the preprocessed sensing data is to be selected. When the preprocessed sensing data is selected, the master manager 920 determines state information of each of the battery cells based on the preprocessed sensing data. Also, the master manager 920 determines state information of the battery pack 930 based on the state information of each of the battery cells.

The above description of FIGS. 1 through 7 is also applicable to the examples of FIGS. 8 and 9, and thus is not repeated herein.

Figure 10:
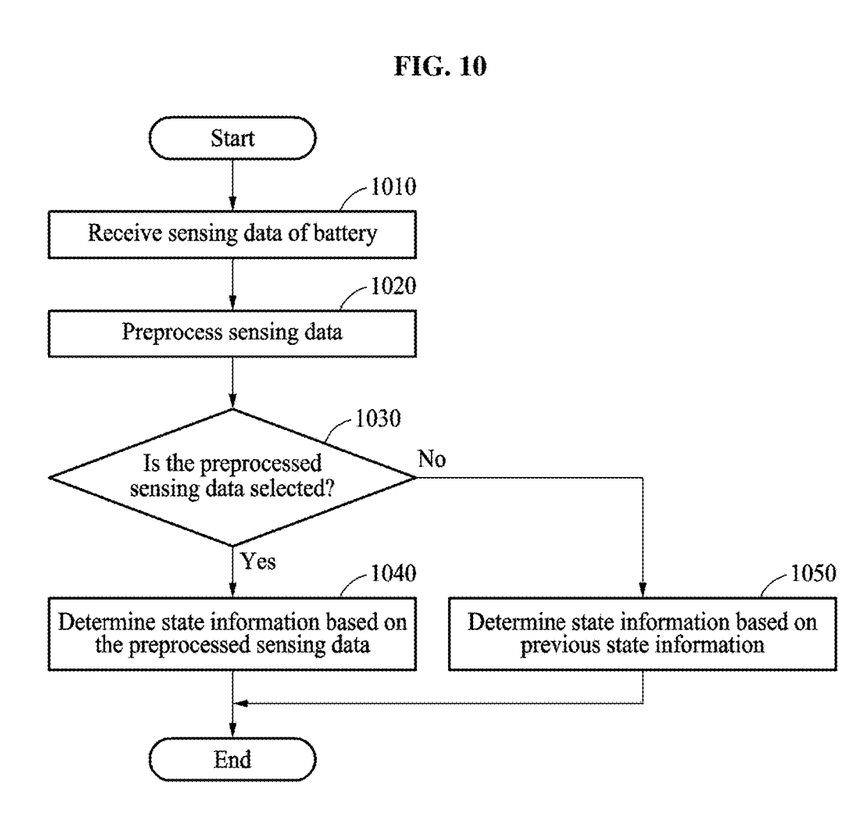
FIG. 10 is a diagram illustrating an example of a battery state estimation method.

FIG. 10 is a diagram illustrating an example of a battery state estimation method. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. One or more blocks of FIG. 10, and combinations of the blocks, can be implemented by special purpose hardware-based computer that perform the specified functions, or combinations of special purpose hardware and computer instructions. In addition to the description of FIG. 10 below, the above descriptions of FIGS. 1-9 is also applicable to FIG. 10, and are incorporated herein by reference. Thus, the above description may not be repeated here.

The battery state estimation method of FIG. 10 is performed by, for example, a battery state estimation apparatus.

Referring to FIG. 10, in 1010, the battery state estimation apparatus receives sensing data of a battery.

In 1020, the battery state estimation apparatus preprocesses the sensing data.

In 1030, the battery state estimation apparatus determines whether the preprocessed sensing data is to be selected, based on feature information of the preprocessed sensing data. In an example, when a length of the preprocessed sensing data is greater than or equal to a length, the battery state estimation apparatus selects the preprocessed sensing data. In another example, the battery state estimation apparatus calculates a deviation between each of sample values of the preprocessed sensing data and a previous sample value of each of the sample values. The battery state estimation apparatus selects the preprocessed sensing data based on a variance of the calculated deviation.

In 1040, the battery state estimation apparatus determines state information of the battery based on the preprocessed sensing data when the preprocessed sensing data is selected.

In 1050, the battery state estimation apparatus determines the state information based on previous state information of the battery when the preprocessed sensing data is not selected.

Figure 11:
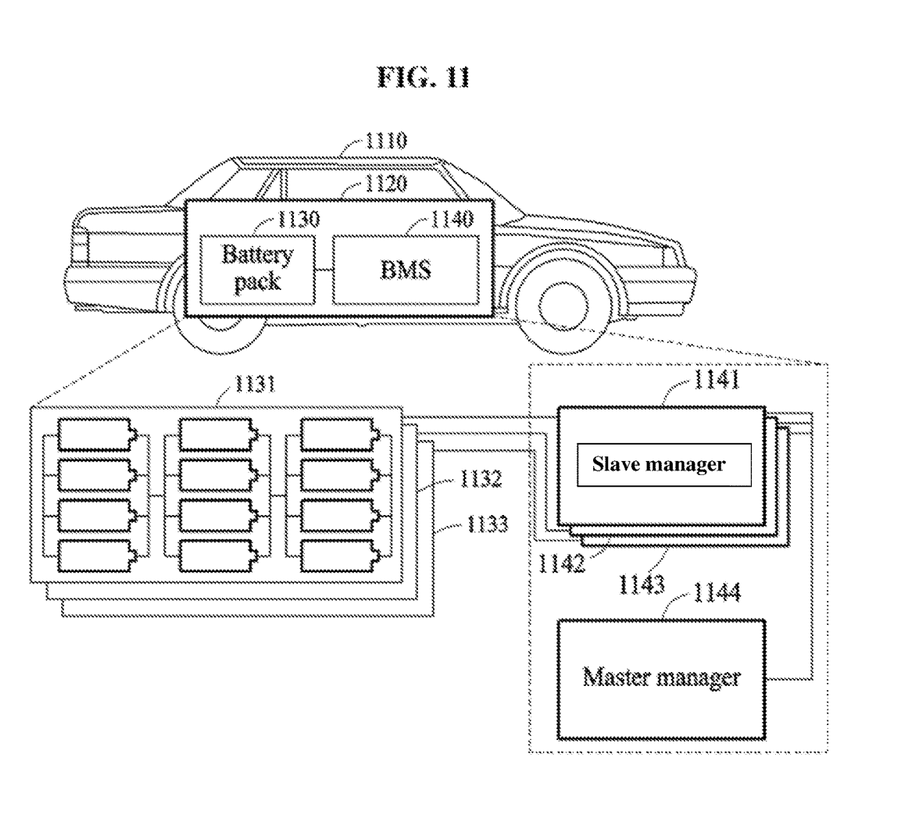
FIGS. 11 and 12 are diagrams illustrating examples of vehicles.
Figure 12:
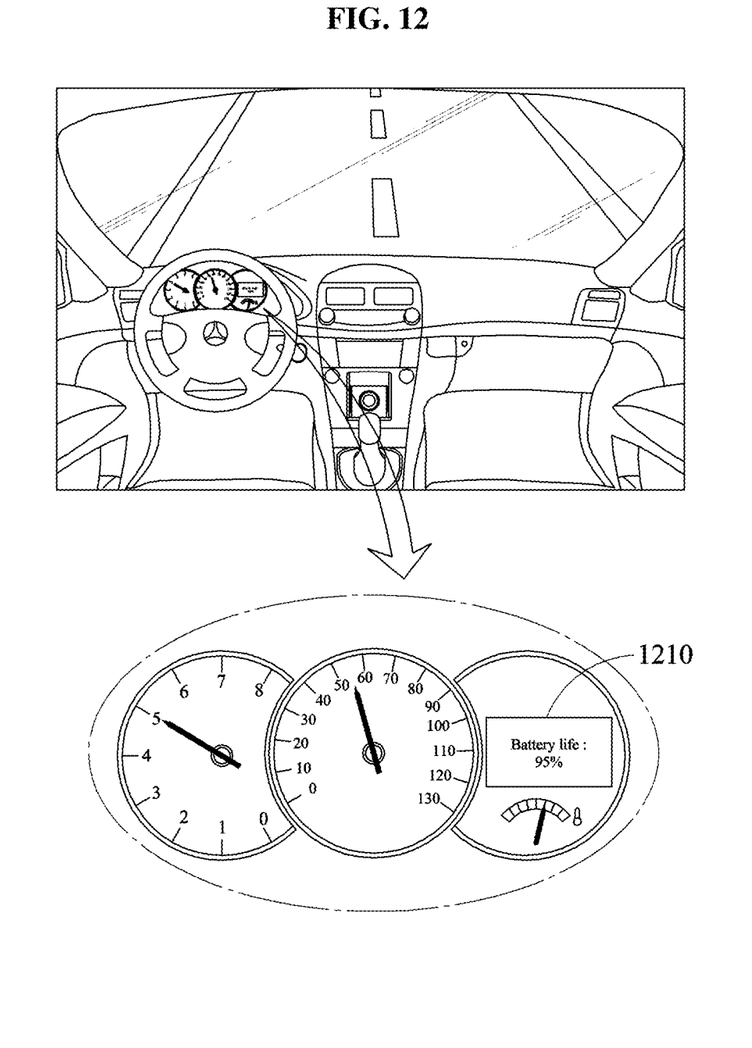

FIGS. 11 and 12 illustrate examples of vehicles using the battery state estimation apparatus.

Referring to FIG. 11, a vehicle 1110 uses electric energy for propulsion. The vehicle 1110 includes, for example, an electric vehicle (EV), a plug-in hybrid electric vehicle (PHEV), or a hybrid electric vehicle (HEV).

The vehicle 1110 includes a battery system 1120.

The battery system 1120 includes a battery pack 1130 and a BMS 1140. In FIG. 11, the BMS 1140 is located outside the battery pack 1130, however, this is merely an example. In another example, the BMS 1140 may be included in the battery pack 1130.

The battery pack 1130 includes battery modules 1131, 1132 and 1133. Each of the battery modules 1131, 1132 and 1133 includes at least one battery cell.

Slave managers 1141, 1142 and 1143 and a master manager 1144 perform functions or operations of the above-described battery state estimation apparatus 100 of FIG. 1. For example, each of the slave managers 1141, 1142 and 1143 corresponds to the slave manager 810 of FIG. 8 or the slave manager 910 of FIG. 9, and the master manager 1144 corresponds to the master manager 820 of FIG. 8 or the master manager 920 of FIG. 9. The master manager 1144 determines state information of the battery pack 1130.

The master manager 1144 displays the state information of the battery pack 1130 on a display in the vehicle 1110 using a vehicle controller (not shown). For example, referring to FIG. 12, state information 1210 of a battery pack is displayed on a display. In an example, the display may be a physical structure that includes one or more hardware components that provide the ability to render a user interface and/or receive user input. The display can encompass any combination of display region, gesture capture region, a touch sensitive display, and/or a configurable area. In an example, the display can be embedded in the battery state estimation apparatus. In an example, the display is an external peripheral device that may be attached to and detached from the battery state estimation apparatus. The display may be a single-screen or a multi-screen display. A single physical screen can include multiple displays that are managed as separate logical displays permitting different content to be displayed on separate displays although part of the same physical screen. In an example, the display is a head-up display (HUD), a vehicular infotainment system, a dashboard in a vehicle, or a screen in the vehicle that used augmented reality. The display may also be implemented as an eye glass display (EGD), which includes one-eyed glass or two-eyed glasses.

Depending on examples, the master manager 1144 acoustically outputs the state information of the battery pack 1130 using the vehicle controller.

FIGS. 1 through 10 is also applicable to the example of FIG. 11, and thus is not repeated herein.

In an example, the battery state estimation apparatus or the BMS is included in a large capacity battery system, for example, an energy storage system (ESS).

In an example, the battery state estimation apparatus or the BMS is included in a device management system or an electronic device that includes a rechargeable battery, such as, for example, an intelligent agent, a mobile phone, a cellular phone, a smart phone, a wearable smart device (such as, for example, a ring, a watch, a pair of glasses, glasses-type device, a bracelet, an ankle bracket, a belt, a necklace, an earring, a headband, a helmet, a device embedded in the cloths), a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, a smart appliance, content players, communication systems, image processing systems, graphics processing systems, other consumer electronics/information technology (CE/IT) device, or any other device capable of wireless communication or network communication consistent with that disclosed herein or various other Internet of Things (IoT) devices that are controlled through a network.

The electronic devices may also be implemented as a wearable device, which is worn on a body of a user. In one example, a wearable device may be self-mountable on the body of the user, such as, for example, a ring, a watch, a pair of glasses, glasses-type device, a bracelet, an ankle bracket, a belt, a band, an anklet, a belt necklace, an earring, a headband, a helmet, a device embedded in the cloths, or as an eye glass display (EGD), which includes one-eyed glass or two-eyed glasses.

The battery state estimation apparatus 100, receiver 110, preprocessor 120, selector 130, state estimator 140, slave manager 1141, 1142, 1143 810 or 910, master manager 820, 1144, or 920, BMS 1140, and other apparatuses, units, modules, devices, components are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state estimation method comprising:
    receiving sensing data of a battery;
    acquiring feature information by preprocessing the sensing data;
    selecting the preprocessed sensing data based on the feature information; and
    determining state information of the battery based on either one or both of the selected preprocessed sensing data and previous state information of the battery.

2. The battery state estimation method of claim 1, wherein the feature information comprises any one or any combination of a data size of the preprocessed sensing data and a variance value of the preprocessed sensing data.

3. The battery state estimation method of claim 1, wherein the selecting of the preprocessed sensing data comprises:
    calculating a reliability of the preprocessed sensing data based on the feature information; and
    selecting the preprocessed sensing data by comparing the reliability to a threshold.

4. The battery state estimation method of claim 1, wherein the selection of the preprocessed sensing data comprises selecting the preprocessed sensing data in response to a length of the preprocessed sensing data being greater than or equal to a threshold.

5. The battery state estimation method of claim 1, wherein the selection of the preprocessed sensing data comprises:
    calculating a deviation between each of sample values of the preprocessed sensing data and a previous sample value of the each of the sample values; and
    selecting the preprocessed sensing data based on a variance of the calculated deviation.

6. The battery state estimation method of claim 1, wherein the determining of the state information comprises determining the state information based on Gall the previous state information in response to the preprocessed sensing data not being selected.

7. The battery state estimation method of claim 1, wherein the determining of the state information comprises determining the previous state information as the state information in response to the preprocessed sensing data not being selected.

8. The battery state estimation method of claim 1, wherein the determining of the state information comprises determining the state information based on the preprocessed sensing data in response to the preprocessed sensing data being selected.

9. The battery state estimation method of claim 1, wherein the acquiring of the feature information comprises:
    filtering the sensing data; and
    downsampling the filtered sensing data.

10. The battery state estimation method of claim 1, wherein
    the preprocessed sensing data corresponds to data suitable for estimation of a state of the battery, in response to the preprocessed sensing data being selected, and
    the preprocessed sensing data corresponds to data unsuitable for the estimation of the state of the battery, in response to the preprocessed sensing data not being selected.

11. A non-transitory computer-readable storage medium storing instructions, that when executed by a processor, causes the processor to perform the battery state estimation method of claim 1.

12. A battery state estimation apparatus comprising:
    a controller configured to receive sensing data of a battery, to acquire feature information by preprocessing the sensing data, select the preprocessed sensing based on the feature information, and to determine state information of the battery based on either one or both of the selected preprocessed sensing data and previous state information of the battery.

13. The battery state estimation apparatus of claim 12, wherein the feature information comprises any one or any combination of a data size of the preprocessed sensing data and a variance value of the preprocessed sensing data.

14. The battery state estimation apparatus of claim 12, wherein the controller is further configured to calculate a reliability of the preprocessed sensing data based on the feature information and to select the preprocessed sensing data by comparing the reliability to a threshold.

15. The battery state estimation apparatus of claim 12, wherein the controller is further configured to select the preprocessed sensing data in response to a length of the preprocessed sensing data being greater than or equal to a threshold.

16. The battery state estimation apparatus of claim 12, wherein the controller is further configured to calculate a deviation between each of sample values of the preprocessed sensing data and a previous sample value of the each of the sample values, and to select the preprocessed sensing data based on a variance of the calculated deviation.

17. The battery state estimation apparatus of claim 12, wherein the controller is further configured to determine the state information based on the previous state information in response to the preprocessed sensing data not being selected.

18. The battery state estimation apparatus of claim 12, wherein the controller is further configured to determine the previous state information as the state information in response to the preprocessed sensing data not being selected.

19. The battery state estimation apparatus of claim 12, wherein the controller is further configured to determine the state information based on the preprocessed sensing data in response to the preprocessed sensing data being selected.

20. The battery state estimation apparatus of claim 12, wherein the controller is further configured to filter the sensing data and to downsample the filtered sensing data.

21. The battery state estimation apparatus of claim 12, wherein
the preprocessed sensing data corresponds to data suitable for estimation of a state of the battery, in response to the preprocessed sensing data being selected, and
the preprocessed sensing data corresponds to data unsuitable for the estimation of the state of the battery, in response to the preprocessed sensing data not being selected.

* * * * *